(12) United States Patent
Nakagawa et al.

(10) Patent No.: US 8,508,701 B2
(45) Date of Patent: Aug. 13, 2013

(54) DISPLAY DEVICE

(75) Inventors: Atsuo Nakagawa, Mobara (JP); Eiji Oohira, Mobara (JP)

(73) Assignees: Hitachi Displays, Ltd., Chiba (JP); Panasonic Liquid Crystal Displays Co., Ltd., Hyogo-Ken (JP)

( * ) Notice: Subject to any disclaimer, the term of this patent is extended or adjusted under 35 U.S.C. 154(b) by 233 days.

(21) Appl. No.: 13/083,714

(22) Filed: Apr. 11, 2011

(65) Prior Publication Data

US 2011/0249222 A1   Oct. 13, 2011

(30) Foreign Application Priority Data

Apr. 13, 2010  (JP) ................................. 2010-091925

(51) Int. Cl.
*G02F 1/1333* (2006.01)
*G02F 1/1335* (2006.01)

(52) U.S. Cl.
USPC .............................. 349/122; 349/12; 349/106

(58) Field of Classification Search
USPC ............ 349/12, 105–108, 110, 122; 345/173
See application file for complete search history.

(56) References Cited

U.S. PATENT DOCUMENTS 8,004,620 B2 *  8/2011  Ishii et al. ........................ 349/12
2010/0245705 A1  9/2010  Nakagawa et al.

FOREIGN PATENT DOCUMENTS

JP   2010-237447   10/2010

* cited by examiner

*Primary Examiner* — Dung Nguyen

(74) *Attorney, Agent, or Firm* — Antonelli, Terry, Stout & Kraus, LLP.

(57) ABSTRACT

The display device according to the present invention is a display device having a display panel and a front window (FW) provided on a front surface side of the display panel, and has: a colored portion 20 having a thickness of 20 μm or more printed on a rear surface of the front window and formed around a display region of the display panel; a first adhesive film 31 having approximately the same thickness as the colored portion placed inside the colored portion so as to not overlap the colored portion; and a second adhesive film 32 placed so as to cover the colored portion 20 and the first adhesive film 31.

10 Claims, 4 Drawing Sheets

DISPLAY DEVICE

CROSS-REFERENCE TO RELATED APPLICATION

The present application claims priority over Japanese Application JP 2010-091925 filed on Apr. 13, 2010, the contents of which are hereby incorporated into this application by reference.

BACKGROUND OF THE INVENTION (1) Field of the Invention

The present invention relates to a display device, and in particular to a display device having a front window.

(2) Description of the Related Art

Various types of display devices, such as liquid crystal modules (liquid crystal display devices) and organic electroluminescent display devices, have been used for many portable information devices, such as cellular phones, personal digital assistants (PDA's), digital cameras and multimedia players.

In recent years, such display devices have generally had a hybrid structure where a transparent protective cover is pasted as a front window in order to protect the display panel, as shown in JP 2010-237447A. In addition, multifunctional display devices have been provided with a touch panel (TP), as shown in FIG. 1, and thus a structure where a touch panel and a front window have been pasted in sequence to the display panel on the surface side has been proposed.

In the touch panel shown in FIG. 1, a flexible printed circuit 11 for wiring is connected to the capacitive touch panel glass 10, and furthermore, an electronic part 12 for controlling the operation of the touch panel is provided and an interface terminal portion 13 is formed at the other end of the flexible printed circuit if necessary.

Meanwhile, as shown in FIG. 2, the colored section 20 is printed on the rear surface of the front window (FW), excluding the image display region of the display panel. Particularly in the case of a liquid crystal display device, the section 20 is colored black so that light from the backlight does not leak from any other area than the image display region.

The colored section of the front windows, however, are directly looked at by the user, and therefore it has been required for the section to be of a color other than black in recent years. It is indispensible for the colored section other than black to be printed with a thicker layer in order to prevent light from leaking.

In the case where the section on the front window is printed with a color other than black, as shown in FIGS. 3 and 4, bubbles (voids in the adhesive film) easily form between the adhesive film 30 and the front window (A) or between the adhesive film 30 and the touch panel (TP) (B) in the vicinity of the colored section 20 when the front window (FW) is pasted to the touch panel (TP) or the display panel.

SUMMARY OF THE INVENTION

An object to be achieved by the present invention is to solve the above described problem and provide a display device where it is possible to paste the front window and the display panel together while preventing bubbles from forming, even in the case where the front window is printed with a color other than black.

The present inventors conducted diligent research, and as a result found a way to print a black frame 21 when a colored section 20 other than black was printed on the front widow, as shown in FIG. 5. Part of the colored portion was made thin so that the adhesive film 30 could overlap this thin portion. As a result, no bubbles formed in the adhesive film. However, this caused a region where the front window (FW) did not make contact with the touch panel (TP) or the display panel to extend widely in the periphery. Thus, a new problem was found in that it became easy for the front window to be peeled from the touch panel.

The present inventors conducted further research and invented a display device having the following characteristics in order to achieve the above described object.

(1) A display device having a display panel and a front window provided on a front surface side of the display panel is characterized by having: a colored portion having a thickness of 20 μm or more printed on a rear surface of the front window and formed around a display region of the display panel; a first adhesive film having approximately the same thickness as the colored portion placed inside the colored portion so as to not overlap the colored portion; and a second adhesive film placed so as to cover the colored portion and the first adhesive film.

(2) The display device according to the above described (1) is characterized by comprising a frame printed inside the colored portion so as to make contact with the colored portion, wherein the first adhesive film is placed inside the colored portion so as to overlap the frame but not overlap the colored portion.

(3) The display device according to the above described (2) is characterized in that the frame has a thickness of 10 μm or less.

(4) The display device according to any of the above described (1) to (3) is characterized in that a touch panel is pasted to the second adhesive film.

(5) The display device according to any of the above described (1) to (4) is characterized in that the display panel is a liquid crystal display panel or an organic electroluminescent display panel, and a polarizing plate is pasted to the second adhesive layer.

The present invention makes it possible to provide a display device where the front window and the touch panel can be pasted together, including the periphery, without bubbles forming by using two adhesive films, even in the case where the front window is printed with a color other than black. In addition, the use of a thin frame that has been printed can prevent the user from seeing the gap between the colored portion and the first adhesive film provided that there is a gap, and thus the device remains aesthetically pleasing.

DESCRIPTION OF THE EMBODIMENTS

Figure 1:
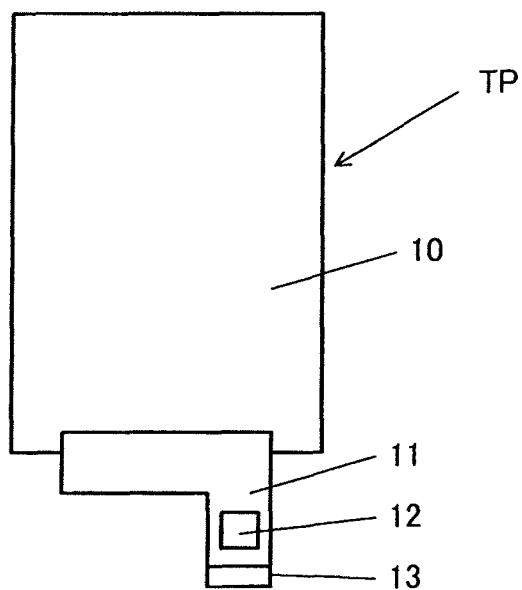
FIG. 1 is a plan diagram showing a touch panel.
Figure 2:
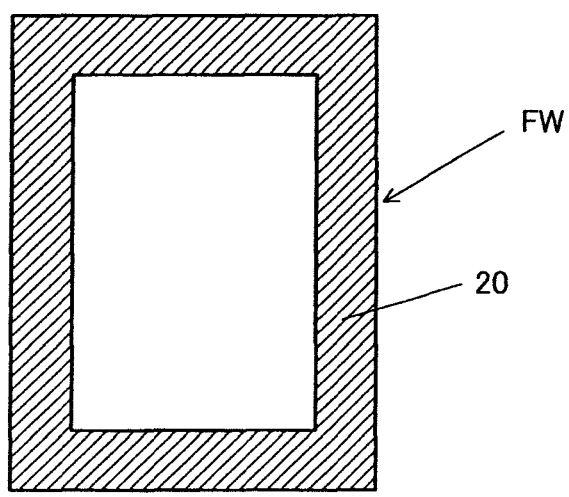
FIG. 2 is a plan diagram showing a front window.
Figure 3:
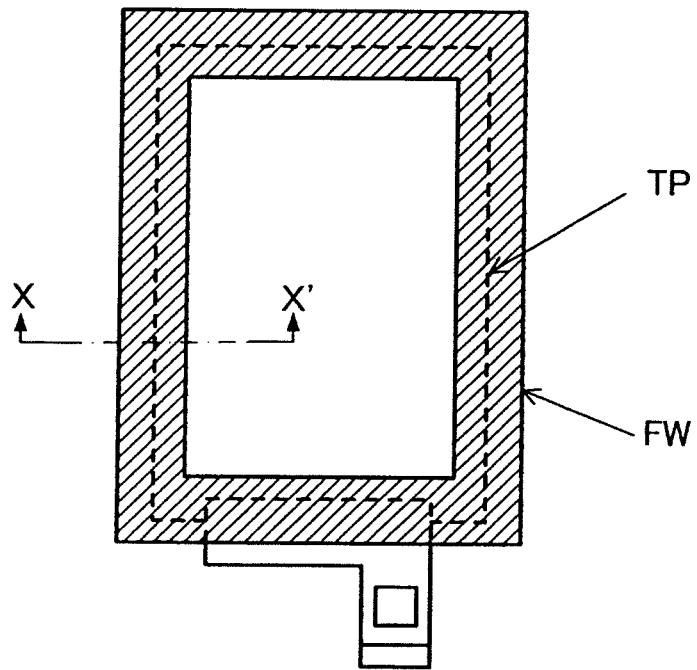
FIG. 3 is a plan diagram showing the front window and the touch panel pasted together.
Figure 4:
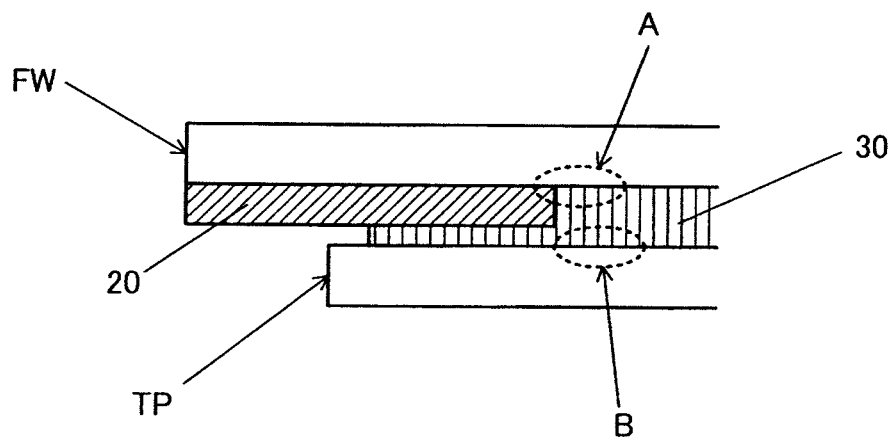
FIG. 4 is a cross sectional diagram along line X-X' of FIG. 3.
Figure 5:
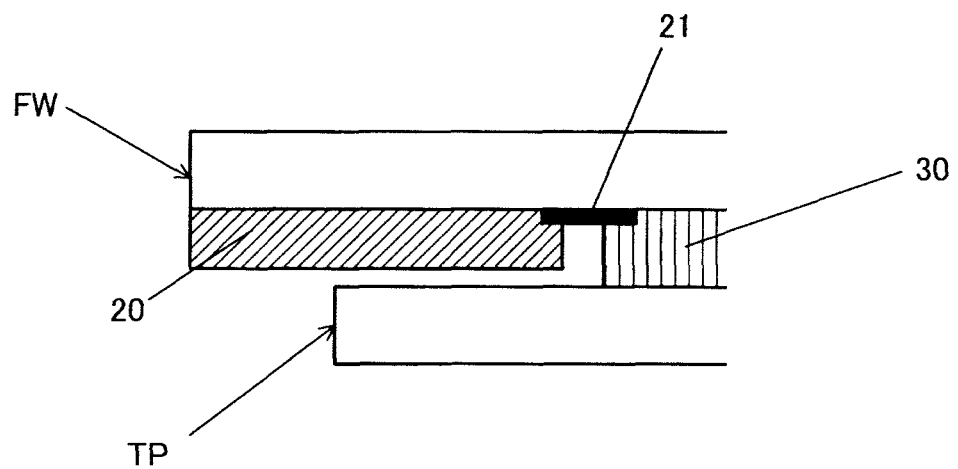
FIG. 5 is a cross sectional diagram of an example where a frame is printed inside a colored section.
Figure 6:
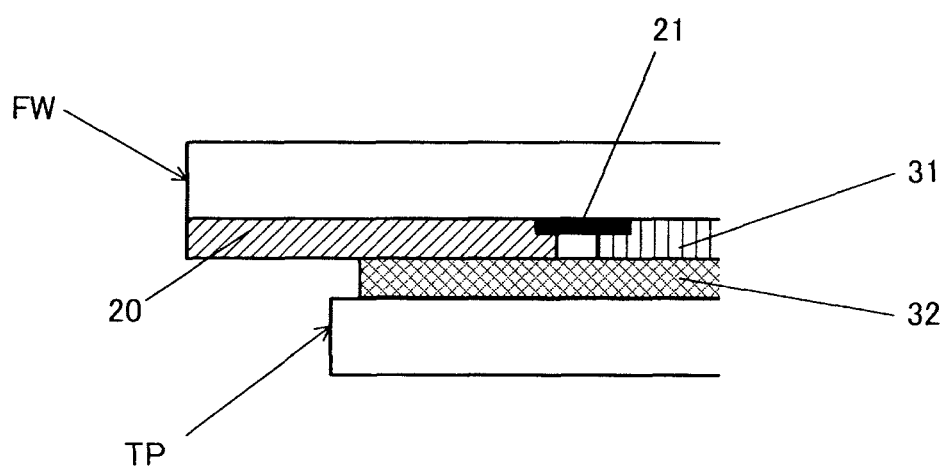
FIG. 6 is a cross sectional diagram showing the display device according to the present invention.

The display device according to the present invention is described in detail below. FIG. 6 is a cross sectional diagram showing the display device according to the present invention.

The display device according to the present invention is a display device having a display panel and a front window (FW) provided on a front surface side of the display panel, and is characterized by having: a colored portion 20 having a thickness of 20 μm or more printed on a rear surface of the front window and formed around a display region of the display panel; a first adhesive film 31 having approximately the same thickness as the colored portion placed inside the colored portion so as to not overlap the colored portion; and a second adhesive film 32 placed so as to cover the colored portion 20 and the first adhesive film 31.

Though the thickness of the second adhesive film 32 is not particularly limited, it is preferable for the second adhesive film 32 to be larger than the first adhesive film 31 and to be smaller than the touch panel (touch panel glass) (TP) that is pasted to the second adhesive film 32, as shown in FIG. 6.

In addition, it is preferable for the gap between the colored portion 20 and the first adhesive film 31 to be as small as possible. The gap refracts light, and thus causes a problem such that light leaks from the periphery of the display screen. In order to solve this problem, it is possible to print a frame 21, as shown in FIG. 6.

The frame 21 is printed inside the colored portion 20 so as to make contact with the colored portion. It is preferable for the color to be black or any other similarly dark color, and it is necessary for the frame to have a thickness of 10 μm or less. In addition, the first adhesive film is placed so as to overlap the frame, and therefore if the frame is too thick, it causes bubbles to form in the same manner as in the colored portion.

Figure 7:
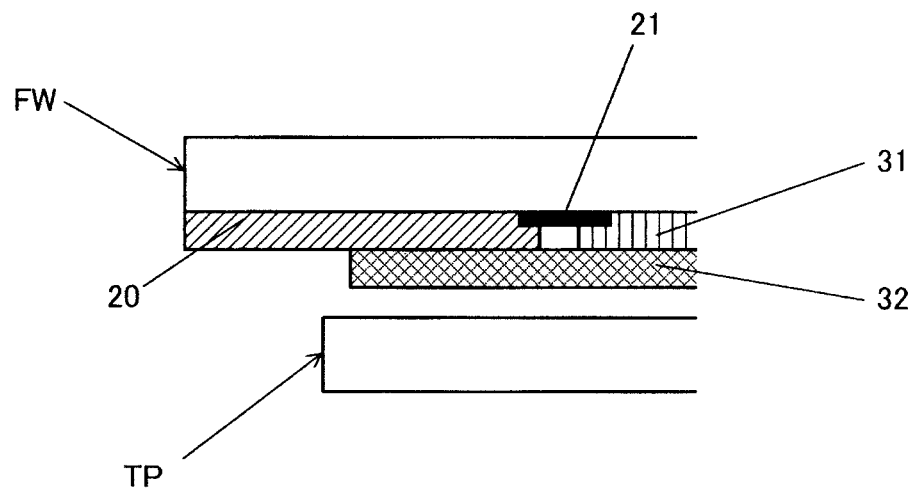
FIG. 7 is a diagram illustrating how the display device according to the present invention is assembled.
Figure 8:
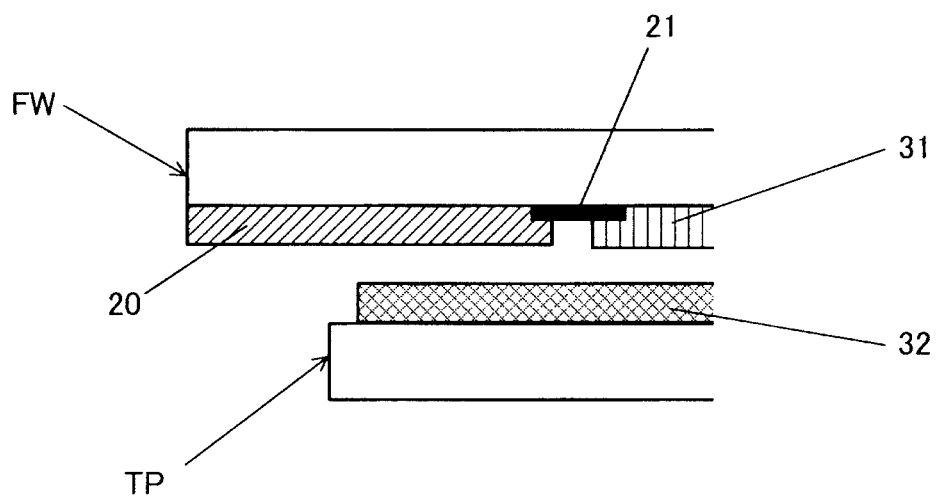
FIG. 8 is a diagram illustrating how the display device according to the present invention is assembled in accordance with another method.

The front window (FW) and the touch panel (TP) can be pasted together following the assembly process in FIG. 7 or 8. FIG. 7 shows a method according to which two adhesive films are pasted to the front window in advance, and this is connected to the touch panel (TP) in the end. FIG. 8 shows a method according to which the first adhesive film 31 and the second adhesive film 32 are pasted to the front window and the touch panel respectively, and the two are pasted together in the end. Though basically either method can be adopted, the price of the touch panel is higher than that of the front window, and therefore it is possible to prevent the manufacturing cost from increasing by pasting the touch panel at the final stage, as in FIG. 7, taking the risk of failure during assembly into consideration.

Though the present invention is described by citing an example where a touch panel is pasted to the front window, the display device according to the present invention is not limited to this and a polarizing plate to be used for a liquid crystal display device or an organic electroluminescent display device may be pasted.

As described above, the present invention makes it possible to provide a display device where the front window and the display panel can be pasted together while preventing bubbles from forming, even in the case where the front window is printed with a color other than black.

What is claimed is:

1. A display device having a display panel and a front window provided on a front surface side of the display panel, characterized by comprising:
    a colored portion having a thickness of 20 μm or more printed on a rear surface of the front window and formed around a display region of the display panel;
    a first adhesive film having approximately the same thickness as the colored portion placed inside the colored portion so as to not overlap the colored portion; and
    a second adhesive film placed so as to cover the colored portion and the first adhesive film.

2. The display device according to claim 1, characterized by comprising a frame printed inside the colored portion so as to make contact with the colored portion, wherein
    the first adhesive film is placed inside the colored portion so as to overlap the frame but not overlap the colored portion.

3. The display device according to claim 2, characterized in that the frame has a thickness of 10 μm or less.

4. The display device according to claim 1, characterized in that a touch panel is pasted to the second adhesive film.

5. The display device according to claim 1, characterized in that the display panel is a liquid crystal display panel or an organic electroluminescent display panel, and a polarizing plate is pasted to the second adhesive layer.

6. The display device according to claim 2, characterized in that a touch panel is pasted to the second adhesive film.

7. The display device according to claim 2, characterized in that the display panel is a liquid crystal display panel or an organic electroluminescent display panel, and a polarizing plate is pasted to the second adhesive layer.

8. The display device according to claim 3, characterized in that a touch panel is pasted to the second adhesive film.

9. The display device according to claim 3, characterized in that the display panel is a liquid crystal display panel or an organic electroluminescent display panel, and a polarizing plate is pasted to the second adhesive layer.

10. The display device according to claim 4, characterized in that the display panel is a liquid crystal display panel or an organic electroluminescent display panel, and a polarizing plate is pasted to the second adhesive layer.

* * * * *